United States Patent [19]

Du et al.

[11] Patent Number: 5,917,323

[45] Date of Patent: Jun. 29, 1999

[54] CORRECTION OF AXIAL IMAGE SIGNAL FALL OFF CAUSED BY MAXWELL TERMS

[75] Inventors: Yping Du; Xiaohong Zhou, both of Pewaukee; Matthew A. Bernstein, Waukesha; Joseph K. Maier, Milwaukee, all of Wis.

[73] Assignee: General Electric Company, Milwaukee, Wis.

[21] Appl. No.: 08/886,830

[22] Filed: Jul. 1, 1997

[51] Int. Cl.[6] .................................................. G01V 3/175
[52] U.S. Cl. .................... 324/309; 324/309; 324/307; 324/306; 324/318; 600/410
[58] Field of Search .................... 324/309, 307, 324/318, 308, 300, 311, 312, 320; 505/844; 600/413, 410

[56] References Cited

U.S. PATENT DOCUMENTS

| | | | |
|---|---|---|---|
| 4,591,789 | 5/1986 | Glover et al. .............................. | 324/307 |
| 5,184,075 | 2/1993 | Nishimura ................................ | 324/309 |
| 5,226,418 | 7/1993 | Bernstein et al. ........................ | 324/306 |
| 5,545,995 | 8/1996 | Schneider et al. ....................... | 324/318 |
| 5,689,186 | 11/1997 | Maier et al. .............................. | 324/309 |
| 5,810,727 | 9/1998 | Groen et al. .............................. | 600/410 |

OTHER PUBLICATIONS

*Nonaxial Whole–Body Instant Imaging,* MRM 29:796–803 (1993), Weisskoff, et al.

*Concomitant Magnetic Field Gradients and Their Effects on Image at Low Magnetic Field Strengths,* MRI, vol. 8, pp. 33–37, 1990, Norris, et al.

*Phase Errors in NMR Images,* Book of Abstracts, Soc. of Mag. Reson. in Med., vol. 1, p. 1037, London UK 1985, Norris.

*EPI Spatial Distortion in Non–Transverse Planes,* Book of Abstracts, Soc. of Mag. Reson. in Med., vol. 1, p. 361, Amsterdam, the Netherlands, 1989, Coxon, et al.

*Reduction of Concomitant Field Gradient Effects by Main Field Alternation,* Proc. of the Soc. of Mag. Reson. in Med., vol. 1, p. 314, Nice France 1995, Claasen–Vujcic, et al.

*On Phase Artifacts of High–Field Fast Spin–Echo Images,* Proc. of the Soc. of Mag. Reson. in Med., vol. 3, p. 1248, New York New York, 1993, Zhou, et al.

*Image Distortion in Coronal Instant Images?,* Book of Abstracts, Soc. of Mag. Reson. in Med., vol. 1, p. 457, New York New York, 1990, Weisskoff.

*Primary Examiner*—John Barlow
*Assistant Examiner*—Brij B. Shrivastav
*Attorney, Agent, or Firm*—Barry E. Sammons; Christian G. Cabou; Phyllis Y. Price

[57] ABSTRACT

Signal fall-off in axial EPI images as well as its variations is corrected by compensating the EPI pulse sequence with gradient pulses that serve to balance the phase dispersion caused by Maxwell terms. Four embodiments are described which employ the slice-selection gradient to compensate the EPI pulse sequence and a fifth embodiment employs the readout gradient.

7 Claims, 5 Drawing Sheets

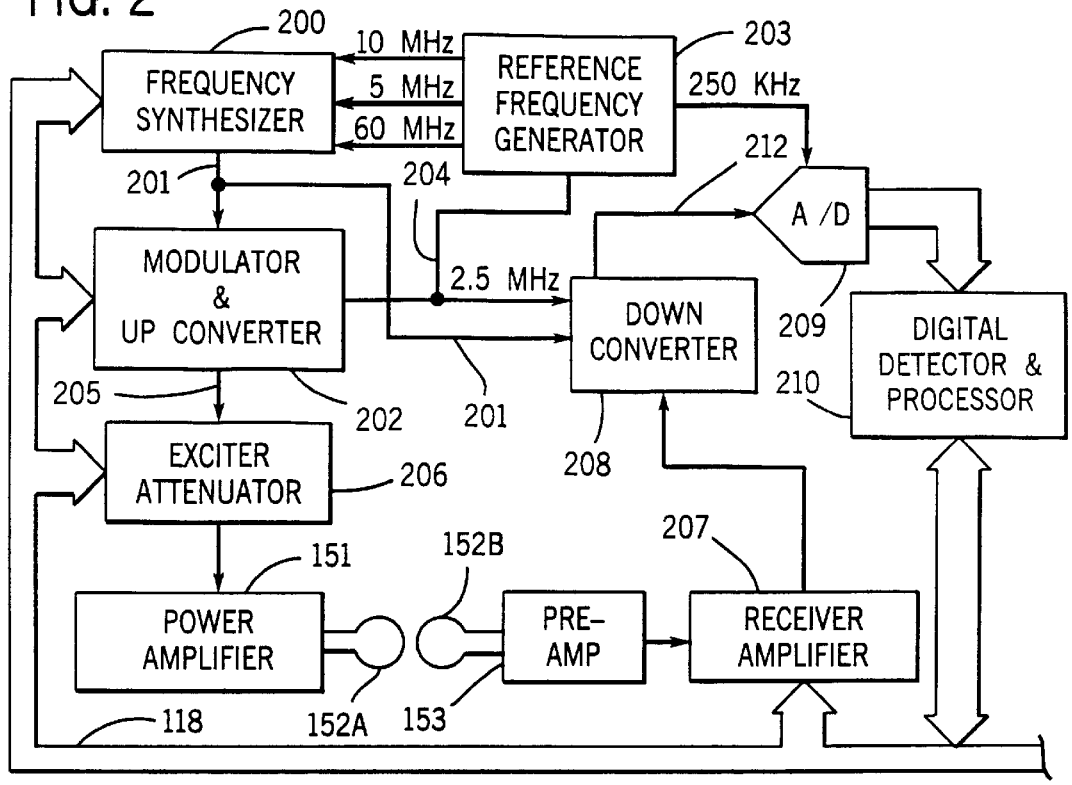
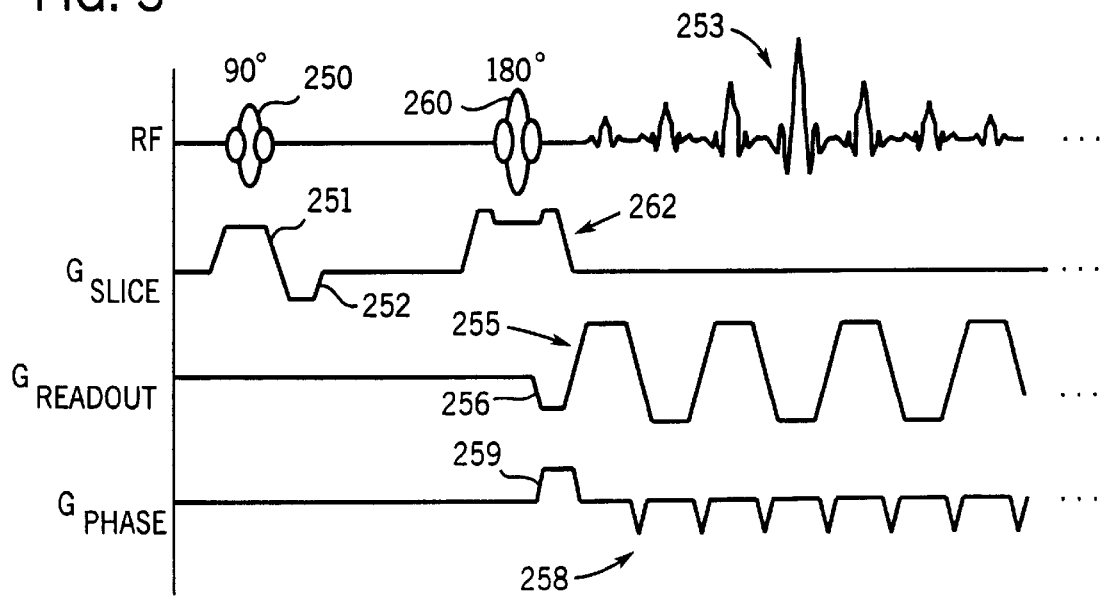

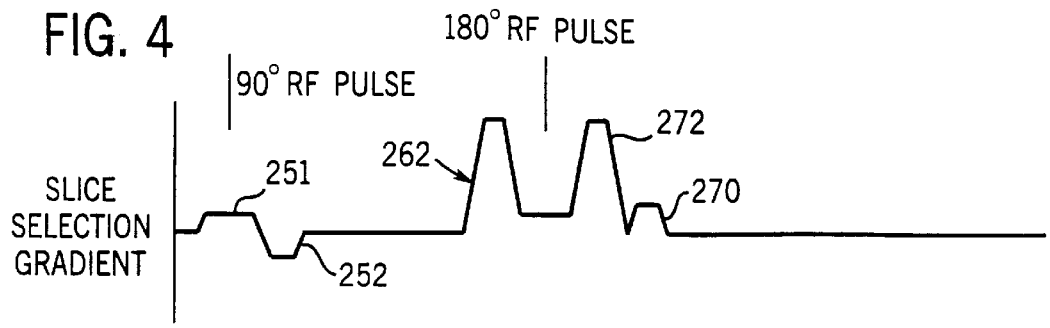
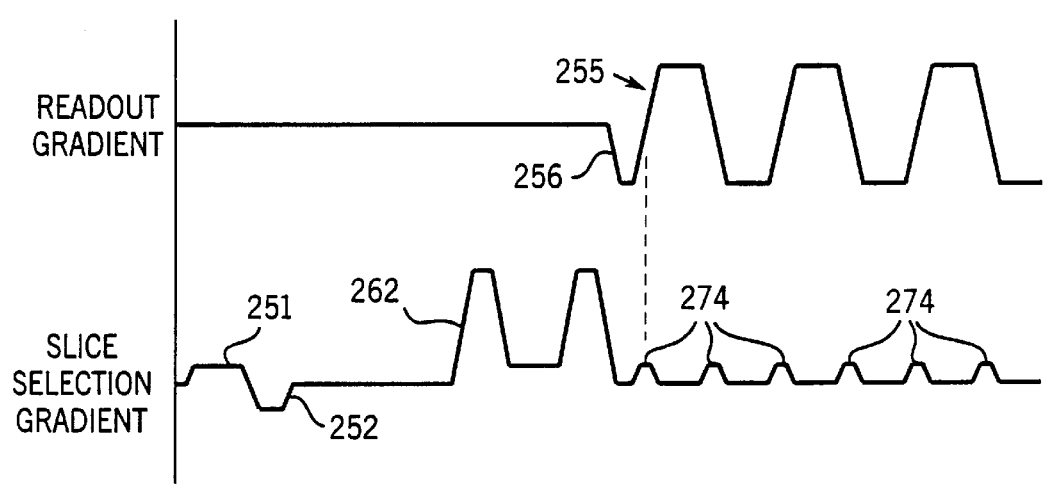
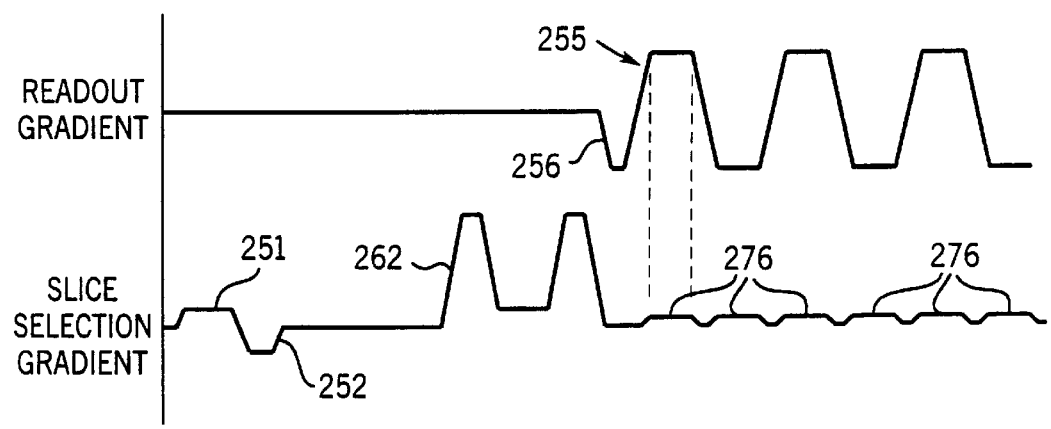

CORRECTION OF AXIAL IMAGE SIGNAL FALL OFF CAUSED BY MAXWELL TERMS

BACKGROUND OF THE INVENTION

The field of the invention is nuclear magnetic resonance imaging methods and systems. More particularly, the invention relates to the correction of image artifacts caused by "Maxwell terms" produced by imaging gradients in MRI systems.

When a substance such as human tissue is subjected to a uniform magnetic field (polarizing field $B_0$), the individual magnetic moments of the spins in the tissue attempt to align with this polarizing field, but precess about it at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, and $G_z$) produce artifacts in the reconstructed images. It is a well known problem, for example, that eddy currents produced by gradient pulses will distort the magnetic field and produce image artifacts. Methods for compensating for such eddy current errors are also well known as disclosed, for example, in U.S. Pat. Nos. 4,698,591; 4,950,994; and 5,226,418.

It is also well known that the gradients may not be perfectly uniform over the entire imaging volume, which may lead to image distortion. Methods for compensating this non-uniformity are well known, and for example, are described in U.S. Pat. No. 4,591,789.

Other than uncompensated eddy current errors and gradient non-uniformity errors that escape correction, it can be assumed that the magnetic field gradients ($G_x$, $G_y$, and $G_z$) produce linear magnetic fields exactly as programmed, thus spatially encoding the NMR data accurately. With these gradients, the overall magnetic field at location (x,y,z) is conventionally given as $B_0 + G_x x + G_y y + G_z z$, and the direction of the field is usually thought to be along the z-axis. This description, however, is not exactly correct. As long as a linear magnetic field gradient is applied, the overall magnetic field is nutated away from the z-axis and its amplitude exhibits higher-order spatial dependencies ($x^2$, $y^2$, $z^2$, $x^2 z$, ...). These phenomena are a direct consequence of the Maxwell equations which require that the overall magnetic field satisfy the following two conditions: $\vec{\nabla} \cdot \vec{B} = 0$ and $\vec{\nabla} \times \vec{B} = \vec{0}$. The higher-order magnetic fields, referred to as "Maxwell terms" (or Maxwell fields), represent a fundamental physics effect, and are not related to eddy currents or imperfection in hardware design and manufacture. Although Maxwell terms have been known for at least a decade, their influence on imaging has been largely ignored because of their negligible effect under conventional imaging conditions.

In axial echo planar imaging (EPI) carried out in a superconducting magnet, it has been observed that the image in an off-center slice ($z \neq 0$) decreases in signal amplitude as the z-offset of the slice increases. This artifact leads to a number of problems. The variation in signal intensity can confuse clinical diagnosis and therapeutic planning, especially when a stack of contiguous axial 2D images are reformatted onto other planes. The loss in signal intensity also reduces the signal-to-noise ratio (SNR) of images.

SUMMARY OF THE INVENTION

The present invention is a method for reducing image artifacts in axial images with z-offset caused by Maxwell terms. More specifically, the present invention is an improvement to a pulse sequence which employs an alternating readout gradient to produce a corresponding series of echo signals to compensate for signal fall-off due to phase dispersion caused by Maxwell fields produced by imaging gradients. This compensation is achieved by adding a gradient area to an existing gradient pulse, or adding a gradient pulse, or adding a series of gradient pulses, which balances the Maxwell phase error. The compensation gradient can be applied as a single pulse prior to acquisition of the NMR signals or as a lower amplitude pulse applied throughout data acquisition. The compensation gradient can also be applied as a series of smaller gradient pulses applied between the acquisition of each NMR signal or during each NMR signal acquisition. In spin echo EPI, the compensation can also be applied by adding a bipolar gradient waveform or a flow-compensated tripolar gradient waveform in the frequency-encoding axis before the 180 degree refocusing RF pulse.

A general object of the invention is to prevent signal fall-off in axial images that are offset from the system's iso-center. It has been discovered that for a given axial location and a given pulse sequence, the spatially quadratic Maxwell phase dispersion responsible for signal fall-off can be calculated and approximated by a spatially linear phase. The pulse sequence can then be compensated by adding a gradient pulse or pulses which cancels the Maxwell phase.

BRIEF DESCRIPTION OF THE DRAWINGS

FIG. 2 is an electrical block diagram of the transceiver which forms part of the MRI system of FIG. 1;

FIG. 3 is a graphic representation of an EPI pulse sequence to which the present invention applies;

FIGS. 4–8 are graphic representations of the changes made to the pulse sequence of FIG. 3 to practice five preferred methods of the present invention;

GENERAL DESCRIPTION OF THE INVENTION

Figure 1:
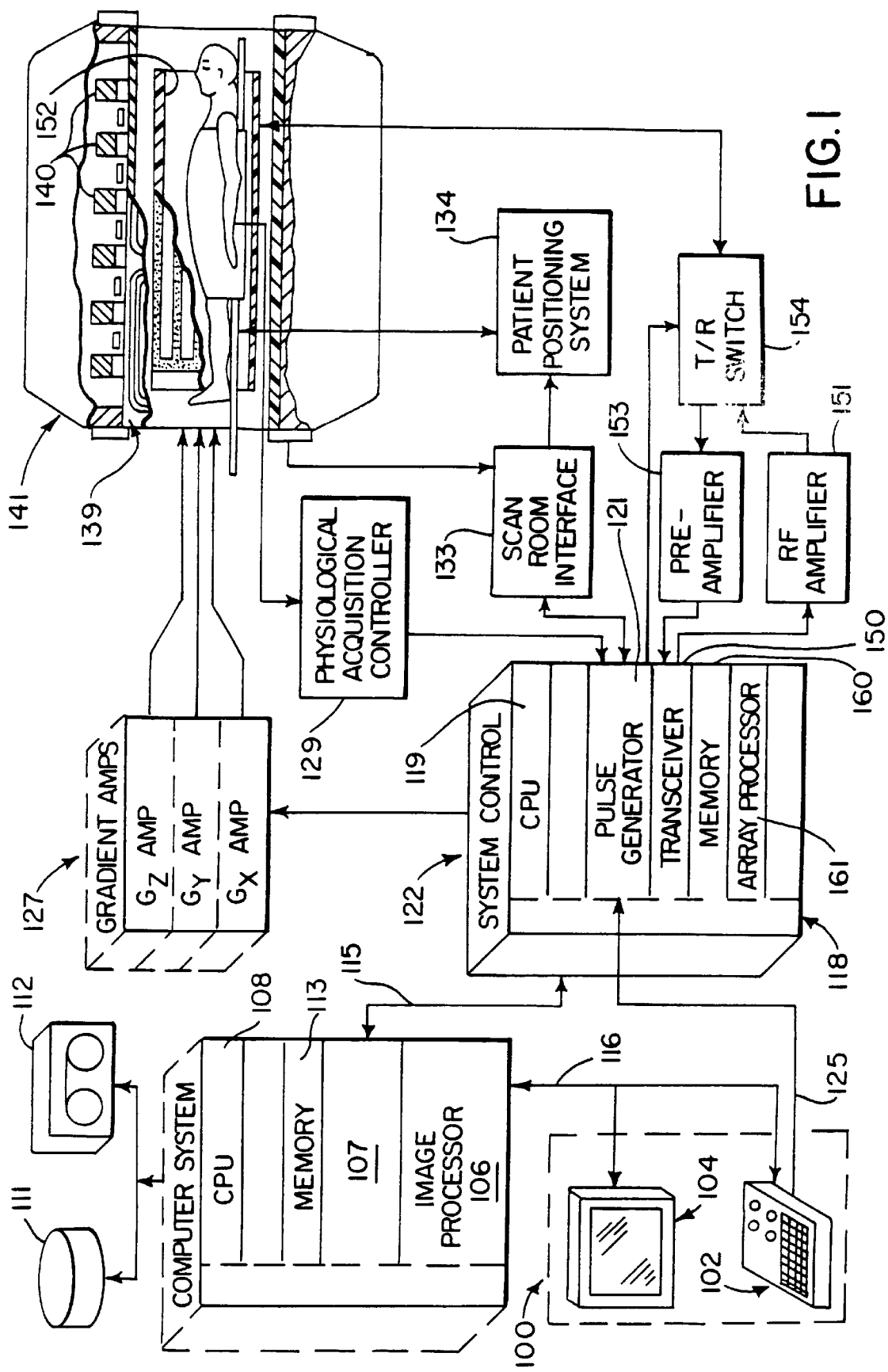
FIG. 1 is a block diagram of an MRI system which employs the present invention.

The Maxwell terms are basically the higher-order spatial gradients (second order, third order, etc.) produced by the linear magnetic field gradients (x, y, and z-gradients). These terms can be directly derived from the Maxwell equations.

According to the Maxwell equations, a magnetic field $\vec{B}$ must satisfy the following two conditions:

$$\vec{\nabla} \cdot \vec{B} = 0 \quad \text{(divergence equation)}, \tag{1a}$$

$$\vec{\nabla} \times \vec{B} = \mu_0 \varepsilon_0 \frac{\partial \vec{E}}{\partial t} + \mu_0 \vec{J} \quad \text{(curl equation)}, \tag{1b}$$

where $\vec{\nabla}$ is the derivative operator ($\vec{\nabla} \equiv \hat{i}\partial/\partial x + \hat{j}\partial/\partial y + \hat{k}\partial/\partial z$), $\vec{E}$ is the electric field, $\vec{J}$ is the current density, and $\mu_0$ and $\varepsilon_0$ are the magnetic permeability and the electric permeability of the free space, respectively. If there is no true and displacement current densities, equation 1b reduces to:

$$\vec{\nabla} \times \vec{B} = \vec{0}. \tag{1c}$$

From equations 1a and 1c, we obtain:

$$\frac{\partial B_x}{\partial x} + \frac{\partial B_y}{\partial y} + \frac{\partial B_z}{\partial z} = 0, \tag{2}$$

$$\frac{\partial B_x}{\partial y} = \frac{\partial B_y}{\partial x}, \tag{3a}$$

$$\frac{\partial B_y}{\partial z} = \frac{\partial B_z}{\partial y}, \tag{3b}$$

$$\frac{\partial B_z}{\partial x} = \frac{\partial B_x}{\partial z}. \tag{3c}$$

The above four equations 2 and 3a–c contain a total of 9 partial derivatives, among which only 5 are independent. Our next task is to select these five independent variables. Recognizing that $$\frac{\partial B_z}{\partial x} \equiv G_x, \frac{\partial B_z}{\partial y} \equiv G_y, \text{ and } \frac{\partial B_z}{\partial z} \equiv G_z$$

($G_x$, $G_y$, and $G_z$ are the linear gradients), we can readily choose $G_x$, $G_y$, and $G_z$ as the first three independent variables. For a radially symmetric $G_z$-field in cylindrical coordinates $\partial B_x/\partial x$ and $\partial B_y/\partial y$ should be identical. However, to cover a more general case, we choose a dimensionless symmetry parameter $\alpha$ as the fourth independent variable:

$$\alpha \equiv -\frac{\partial B_x/\partial x}{G_z}, \text{ or } 1 - \alpha \equiv -\frac{\partial B_y/\partial y}{G_z}. \tag{4a-b}$$

The last independent variable can be conveniently chosen as (based on equation 3a):

$$g \equiv \frac{\partial B_x}{\partial y} = \frac{\partial B_y}{\partial x}. \tag{5}$$

At this point, all the partial derivatives described in equations 2 and 3 can be expressed using the five independent variables $G_x$, $G_y$, $G_z$, $\alpha$, and $g$:

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} = \begin{bmatrix} -\alpha G_z & g & G_x \\ g & -(1-\alpha)G_z & G_y \\ G_x & G_y & G_z \end{bmatrix}. \tag{6}$$

With all the terms, the overall magnetic field becomes:

$$\vec{B} = \vec{i} B_x + \vec{j} B_y + \vec{k} B_z, \tag{7}$$

where, to first order, $$\begin{bmatrix} B_x \\ B_y \\ B_z - B_0 \end{bmatrix} = \begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} \begin{bmatrix} x \\ y \\ z \end{bmatrix} = \tag{8}$$

$$\begin{bmatrix} -\alpha G_z & g & G_x \\ g & -(1-\alpha)G_z & G_y \\ G_x & G_y & G_z \end{bmatrix} \begin{bmatrix} x \\ y \\ z \end{bmatrix}.$$

The above equations have two important implications. First, the $B_0$-field is no longer aligned along the z-axis because of the transverse fields $B_x$ and $B_y$. Second, the amplitude of the $B_0$ field is not simply given by $B = B_0 + G_x x + G_y y + G_z z$, but instead by $$B(x, y, z) = \sqrt{B_x^2 + B_y^2 + B_z^2} \tag{9}$$

($B_0 + G_x x + G_y y + G_z z$ merely represents the z-component of the overall field). If we perform three sequential Taylor series expansions on equation 9 with respect to x, y, and z, respectively, it can be seen that the magnetic field not only has its regular zeroth and first order spatial dependencies, but also shows higher-order spatial components. The result of the Taylor expansion to the second order is given by equation 10:

$$B = B_0 + G_x x + G_y y + G_z z + \frac{1}{2B_0}[\alpha^2 G_z^2 + g^2]x^2 + \tag{10}$$

$$\frac{1}{2B_0}[(1-\alpha)^2 G_z^2 + g^2]y^2 + \frac{1}{2B_0}[G_x^2 + G_y^2]z^2 - \frac{gG_z}{B_0}xy +$$

$$\frac{1}{B_0}[gG_x - (1-\alpha)G_y G_z]yz + \frac{1}{B_0}[gG_y - \alpha G_x G_z]xz.$$

For gradient systems used in MRI, we have $g=0$, and $\alpha \approx \frac{1}{2}$ (due to the cylindrical symmetry). Under these conditions, equation 10 is simplified to:

$$B = B_0 + G_x x + G_y y + G_z z + \frac{1}{8B_0}G_z^2 x^2 + \frac{1}{8B_0}G_z^2 y^2 + \tag{11}$$

$$\frac{1}{2B_0}[G_x^2 + G_y^2]z^2 - \frac{1}{2B_0}G_y G_z yz - \frac{1}{2B_0}G_x G_z xz.$$

Equations 10 and 11 indicate that, whenever a linear magnetic field gradient is applied, higher-order gradient fields will be produced to satisfy the Maxwell equations.

These higher-order gradient fields are referred to as the "Maxwell terms", or "Maxwell fields."

With the inclusion of the Maxwell terms, the 2D NMR signal equation becomes:

$$S(k_x, k_y) = \iint_{x,y} \rho(x, y) e^{-i(k_x x + k_y y)} e^{-i\phi_M} dx\, dy, \quad (12a)$$

$$\phi_M(x, y, z) = \gamma \int_t B_M(G_x, G_y, G_z, x, y, z) dt, \quad (12b)$$

$$B_M = \frac{1}{8B_0} G_z^2 x^2 + \frac{1}{8B_0} G_z^2 y^2 + \frac{1}{2B_0}[G_x^2 + G_y^2]z^2 - \frac{1}{2B_0} G_y G_z yz - \frac{1}{2B_0} G_x G_z xz. \quad (12c)$$

where $\gamma$ is the gyromagnetic ratio, $B_M$ is the Maxwell magnetic field and $\phi_M$ is the associated phase error. As implied by equations 12a–c, the Maxwell phase error depends on the details of each pulse sequence. In some pulse sequences, the phase error can be zero or negligible and thus causes no image degradation. In most other sequences, a non-negligible phase error is produced, giving various image quality problems such as distortion, ghosting, image shift, shading, blurring, and intensity reduction.

In axial EPI carried out in a horizontally placed superconducting magnet, the readout gradient $\vec{G}_{ro}$ can be applied along either x or y-axis. For a general case, $\vec{G}_{ro}$ can be expressed as:

$$\vec{G}_{ro} = \hat{i} G_x + \hat{j} G_y, \quad (13a)$$

$$|\vec{G}_{ro}| \equiv G_{ro} = \sqrt{G_x^2 + G_y^2}, \quad (13b)$$

where $\hat{i}$ and $\hat{j}$ are unit vectors in the $G_x$ and $G_y$ directions, respectively. Note that equation 13a also accounts for oblique scans, although we rarely use oblique scans in the axial plane. According to equation (11), the $z^2$-Maxwell term produced by the $G_x$ and/or $G_y$ gradients is given by:

$$B_M = \frac{1}{2B_0}(G_x^2 + G_y^2)z^2, \quad (14)$$

where $B_0$ is the main magnetic field. Combining equations 13b and 14, we obtain:

$$B_M = \frac{1}{2B_0} G_{ro}^2 z^2. \quad (15)$$

The Maxwell field $B_M$ vanishes at the central slice (z=0), provided the slice is infinitesimally thin. For off-center slices, however, $B_M$ increases parabolically with respect to the slice location z.

Figure 10:
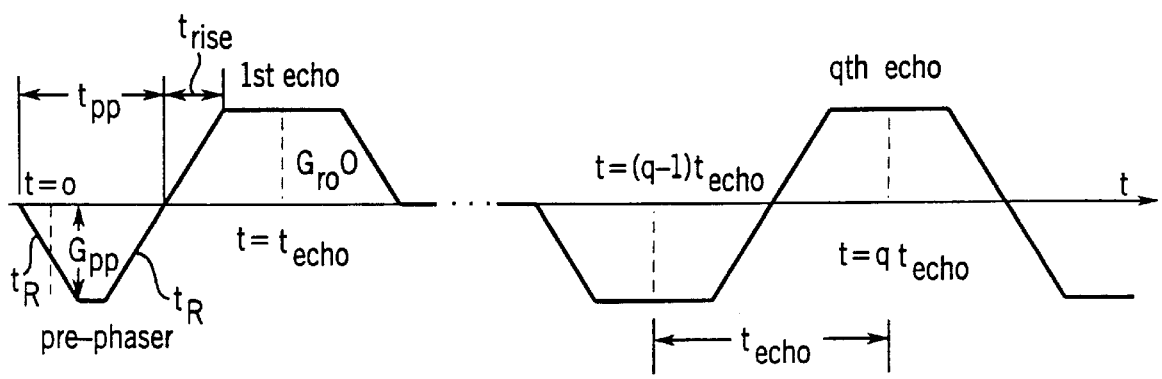
FIG. 10 is a graphic representation of a portion of the readout gradient waveform in an EPI pulse sequence.

The Maxwell field $B_M$ induced by the readout gradient generates a time varying phase, which we call the Maxwell phase. The Maxwell phase accumulates during the echo train, and thus is different from echo to echo. The image intensity of a slice, however, is primarily determined by the center of k-space data. The signal intensity fall-off of an axial slice can be estimated using the Maxwell phase corresponding to the echo with $k_y=0$:

$$\Phi_M(z) = \gamma \int_0^{N_{TE} t_{echo}} B_M(z, t) dt \quad (16)$$

$$= \frac{\gamma}{2B_0} z^2 \int_0^{N_{TE} t_{echo}} G_{ro}^2(t) dt + \eta z^2 \quad (17)$$

$$= \frac{\gamma}{2B_0} N_{TE} z^2 \int_0^{t_{echo}} G_{ro}^2(t) dt + \eta z^2 \quad (18)$$

$$= \frac{\gamma}{2B_0} N_{TE} G_{ro0}^2 \left(t_{echo} - \frac{4}{3} t_{rise}\right) z^2 + \eta z^2, \quad (19)$$

where $G_{ro0}$ is the gradient amplitude of the readout window, $N_{TE}$ (=1, 2, 3, ... ) is the index of the echo corresponding to $k_y=0$, $t_{echo}$ is the time interval between two consecutive echoes (i.e., echo spacing), and $t_{rise}$ is the rise-time of the readout gradient as illustrated in FIG. 10. The second term in equations (17)–(19) accounts for the difference in Maxwell phase generated by the pre-phasing lobe and one half of a readout gradient lobe as shown in FIG. 10:

$$\eta z^2 = \frac{\gamma}{2B_0} G_{pp}^2 \left(t_{pp} - \frac{4}{3} t_R\right) z^2 - \frac{\gamma}{4B_0} G_{ro0}^2 \left(t_{echo} - \frac{4}{3} t_{rise}\right) z^2, \quad (19b)$$

where $G_{pp}$ is the gradient amplitude of the pre-phaser, $t_{pp}$ is the pulse duration of the pre-phaser, and $t_R$ is the ramp duration of the pre-phaser. In the following, we define a coefficient, $\epsilon$:

$$\epsilon = \frac{\gamma}{2B_0} G_{ro0}^2 \left(t_{echo} - \frac{4}{3} t_{rise}\right) + \eta / N_{TE}, \quad (20)$$

so that $$\Phi_M(z) = \epsilon N_{TE} z^2, \text{ and } \frac{d\Phi_M(z)}{dz} = 2\epsilon N_{TE} z. \quad (21)$$

We use a linear axial phase, $\psi_M$, to approximate the quadratic axial phase. The linear phase has the same slope as the quadratic phase at the center of the slice, $z_0$:

$$\psi_M(z_0, z) = 2\epsilon N_{TE} z_0 z + \text{const, for } -\Delta z/2 < z - z_0 < \Delta z/2. \quad (22)$$

Note that the additional constant phase in equation 22 does not contribute to signal intensity in a magnitude image. It is straightforward to find the signal loss for a slice at $z_0$ due to the linear axial phase dispersion as shown in equation 22 is given by:

$$\left|\frac{s(z=z_0)}{s(z=0)}\right| = \left|\int_{z_0-\Delta z/2}^{z_0+\Delta z/2} m_0 e^{i\psi_M(z_0,z)} dz \bigg/ \int_{z_0-\Delta z/2}^{z_0+\Delta z/2} m_0 dz\right| \quad (23)$$

$$= \left|\frac{\sin(\epsilon N_{TE} z_0 \Delta z)}{\epsilon N_{TE} z_0 \Delta z}\right|,$$

where $s(z=z_0)$ is the signal intensity for the slice at $z_0$, $s(z=0)$ is the signal intensity for the slice at iso-center, and $m_0$ is the magnetization of the slice. In equation 23, it is assumed that the slice has a rectangular profile. A numerical simulation indicates that the signal loss due to a linear phase dispersion as shown in equation 22 is nearly the same as the signal loss due to a quadratic phase dispersion as shown in equation 21 for a conventional slice thickness.

The phase dispersion indicated by equation 22 can be largely compensated by adding a corresponding linear axial phase. This can be achieved by adding gradient area to the slice-selection waveform $G_z$ which compensates the quadratic Maxwell phase. Four different methods have been developed to achieve this phase compensation.

In the first method, a gradient lobe is added to generate a linear axial phase which compensates the quadratic Maxwell phase at TE (i.e., at the echo with $k_y=0$ in single-shot EPI). The slope of this linear phase should have the same magnitude as but opposite sign to that of the quadratic Maxwell phase at $z_0$. This gradient area can be added to an existing gradient lobe, such as the right crusher of the 180 degree pulse in spin-echo EPI or the refocusing gradient lobe in gradient-echo EPI. Alternatively, the area can be added by using a new gradient lobe. The area of a trapezoidal gradient lobe on the slice-selection gradient to achieve this is calculated as follows.

If the gradient lobe has a rise time $t_1$, a pulse duration of $t_{base}$ and a gradient amplitude at its flat top, $G_{zo}$, the compensation gradient lobe generates a linear phase along the z-direction:

$$\phi(z) = \gamma z \int_0^{t_{base}} G_z(t) dt, \qquad (24)$$
$$= \gamma G_{z0}(t_{base} - t_1)z = \gamma A_{z0} z,$$

where $A_{z0}$ is the area of the trapezoid lobe. Note that the phase accumulation from this gradient lobe is zero for the slice at iso-center, and linearly increases as the z-offset of the slice increases.

In order for the linear phase generated by this trapezoidal lobe to compensate the quadratic phase generated by the Maxwell field at $z_0$, the following relationship should hold:

$$\frac{d\phi(z)}{dz} = -\frac{d\psi_M(z_0, z)}{dz}, \qquad (25)$$

where $\psi M(z_0, z)$ is given by equation (22). Using equations (22), (24) and (25), the area of the trapezoidal lobe should be:

$$A_{z0} = -\frac{2}{\gamma} \epsilon N_{TE} z_0, \qquad (26)$$

Combining equations (24) and (26), the amplitude of the trapezoidal lobe is then given by:

$$G_{z0}(z_0) = -\frac{2\epsilon N_{TE} z_0}{\gamma(t_{base} - t_1)}. \qquad (27)$$

Note that with fixed $t_{base}$ and $t_1$, the gradient amplitude $G_{z0}$ is proportional to the z-offset, $z_0$.

Because the Maxwell phase accumulates as each EPI pulse sequence proceeds, each acquired echo experiences a different Maxwell phase. In the second method according to the present invention the gradient area defined by equation (27) is divided up into gradient "blips" between successive echoes. This method provides inter-echo correction of the Maxwell phase. Using this method, the area of each blip is determined by:

$$A_{z0} = -\frac{G_{ro0}^2 \left(t_{echo} - \frac{4}{3}t_{rise}\right)z_0}{B_0} \qquad (28)$$

If the second term in equations (17)–(19) is not negligible, the area of the first blip should be modified to include the contribution from the term. The compensation can be further refined by applying an intra-echo correction. Using this method, (i.e., the third method) a trapezoidal gradient lobe with small gradient amplitude is applied on the slice-selection gradient during each echo acquisition. In the presence of this gradient, the Maxwell phase is compensated for each sampled point. The amplitude of the added trapezoidal gradient lobe is determined by:

$$G_{z0} = -\frac{G_{ro}^2 z_0}{B_0}. \qquad (29)$$

The gradient amplitude given by equation (29) can also be applied to compensate the Maxwell phase in EPI where ramp-sampling is used.

Yet another refinement of the compensation method (i.e., the fourth method) is to apply a constant slice-selection gradient during the readout portion of the EPI pulse sequence. This method is an approximation to the third method. This method provides a nearly complete compensation of the Maxwell field effect. This method also has a reduced peak dB/dt compared to the second and third methods described above, because it does not require the switching of the slice-selection gradient when the readout gradient is on the ramp portion of its waveform. Such reduced peak dB/dt helps to prevent possible peripheral nerve stimulation. Using this method, the amplitude of the constant slice-selection gradient is given by:

$$G_{z0} = -\frac{G_{ro0}^2 z_0 \left(t_{echo} - \frac{4}{3}t_{rise}\right)}{B_0 t_{echo}}. \qquad (30)$$

Yet another approach for compensating the spin-echo EPI pulse sequence is to add gradient field lobes to the readout gradient train (i.e., the fifth method). In order not to disrupt the spatial encoding along the readout axis, this compensation field gradient should have a net area of zero. This can be achieved with a bipolar waveform or a three-lobe velocity compensated waveform and it should be applied before the 180° RF pulse. The Maxwell phase generated by this bipolar waveform should be the same as that generated by the $N_{TE}$ readout gradient lobes in the EPI pulse sequence prior to the echo corresponding to $k_y=0$. As an example, when the duration and the rise-time of this bipolar waveform is equal to $2t_{echo}$, and $t_{rise}$, respectively, the required gradient amplitude, $G_M$, of the bipolar waveform is higher than the amplitude of the readout gradient:

$$G_M = \sqrt{\frac{N_{TE}}{2}} G_{ro0}. \qquad (31)$$

If the gradient amplitude shown in equation (31) is higher than the maximum amplitude supported by the gradient systems, the duration of the bipolar waveform needs to be extended. This solution has the advantage that the added bipolar waveform is independent of the z-offset of an axial slice. However, the need of a bipolar waveform with a large gradient amplitude or a long duration may prevent the application of this solution in prescriptions that use a large $N_{TE}$ and a high readout gradient amplitude. Also, this solution is not applicable to gradient-echo EPI in which there is no 180° refocusing RF pulse.

Although the Maxwell term induced signal fall-off is most evident in axial slices for a horizontally placed superconducting magnet, similar problems can also be observed in sagittal and coronal images. For example, in a coronal image (xz-plane) acquired using $G_z$ as the readout gradient, the corresponding Maxwell term becomes:

$$B_M = \frac{G_z^2 x^2}{8B_0} + \frac{G_z^2 y^2}{8B_0}. \tag{32}$$

The first term in equation 32 causes in-plane image distortion, and the second term generates a quadratic phase along the slice-selection direction (y-direction), causing signal fall-off similar to those discussed for axial images. All the theoretical analyses and correction methods presented for axial images are equally applicable to coronal and sagittal images, except that the coefficient of the Maxwell term is four times smaller. It is interesting to note that when the readout gradient is chosen along x-axis in a coronal image, no quadratic Maxwell field along the y-direction is produced. Therefore, the image does not experience signal fall-off. The same argument is also true for sagittal images with the readout direction along the y-axis.

In the analysis of the Maxwell terms, we have assumed a horizontally placed superconducting magnet configuration. When a vertical field permanent magnet or a vertical field resistive magnet is used, the physical z-axis corresponds to the anterior-posterior direction of the patient. Therefore, the coronal images will exhibit the most prominent signal fall-off. The same principles to correct for the artifacts presented for axial slices in superconducting magnet are equally applicable to this case with only minor notational changes.

In cases where the Maxwell phase due to the phase-encoding gradient becomes non-negligible, such as multi-shot EPI with a large number of shots, the Maxwell phase calculation should also include the contribution from phase-encoding and pre-phase-encoding gradient waveforms.

The correction methods of the Maxwell field effect described above can be readily adapted to the cases where a non-trapezoid waveform, for example, a sinusoidal waveform, is used for readout. The Maxwell phase calculation shown in equation (19) should be modified accordingly.

Another variation of the readout gradient can be found in the so-called asymmetric, or "skip-echo", EPI sequences. In these sequences, echoes are acquired only when the readout gradient lobes have the same polarity. In a gradient-echo and spin-echo (GRASE) sequence, the echo train is a combination of spin echoes and gradient echoes. The correction methods stated above can also be modified to correct the Maxwell field effect in asymmetric EPI and GRASE.

In the cases where ramp-sampling is used, the first, second, fourth and fifth correction methods can be applied without modification. However, the third method needs to be modified for proper correction.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, amplitude and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an image data set. This image data set is conveyed through the serial link 115 to the computer system 107 where it is stored in the disk memory 111. In response to commands received from the operator console 100, this image data set may be archived on the tape drive 112, or it may be further processed by the image processor 106 and conveyed to the operator console 100 and presented on the display 104.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877.

Referring still to FIGS. 1 and 2 the signal produced by the subject is picked up by the receiver coil 152B and applied through the preamplifier 153 to the input of another receiver amplifier 207. The receiver amplifier 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The EPI pulse sequence employed in the preferred embodiment of the invention is illustrated in FIG. 3. A 90° RF excitation pulse 250 is applied in the presence of a slice select gradient pulse 251 to produce transverse magnetization in a slice. The excited spins are rephased by a negative lobe 252 on the slice-selection gradient and then a time interval elapses before a 180° RF refocusing pulse 260 is applied in the presence of a slice-selection gradient pulse 262. A total of $N_y$ (e.g., $N_y$=128) separate NMR echo signals, indicated at 253 are acquired during the EPI pulse sequence. Each NMR echo signal 253 is individually phase encoded to scan $k_y$-space in monotonic order.

The NMR echo signals 253 are gradient recalled echoes produced by the application of an oscillating readout gradient 255. The readout sequence is started with a pre-phasing readout gradient lobe 256 and the echo signals 253 are produced as the readout gradient oscillates between positive and negative values. A total of $N_x$ (e.g., $N_x$=128) samples are taken of each NMR echo signal 253 during each readout gradient pulse 255. The successive $N_y$ NMR echo signals 253 are separately phase encoded by a series of phase encoding gradient pulses 258. A pre-phasing phase-encoding lobe 259 occurs before the echo signals acquired to position the central view ($k_y$=0) at the desired echo time (TE) Subsequent phase encoding pulses 258 occur as the readout gradient pulses 255 switch polarity, and they step the phase encoding monotonically upward through $k_y$-space.

At the completion of the EPI pulse sequence, therefore, $N_x$ separate frequency encoded samples of $N_y$ separately phase encoded NMR echo signals 253 have been acquired. After row-flipping for non-skip echo EPI, this $N_x \times N_y$ element array of complex numbers is Fourier transformed along both of its dimensions ($k_y$ and $k_x$) to produce an image data set that indicates the NMR signal magnitude along each of its two dimensions (x and y).

Referring particularly to FIG. 4, the first preferred embodiment of the invention is implemented by altering the slice-selection gradient waveform in the EPI pulse sequence of FIG. 3. More particularly, a trapezoidal gradient lobe 270 is added immediately after the right gradient crusher 272 associated with the 180° RF pulse. The area of the compensation gradient lobe 270 has a fixed duration and a fixed rise-time and its amplitude is proportional to the z-offset of the slice according to equation (27) above.

Referring particularly to FIG. 5, a second preferred embodiment of the invention compensates Maxwell phase between echo acquisitions during each EPI pulse sequence. This is accomplished by adding slice-selection gradient blips 274 between the readout of successive echo signals. The area of each gradient blip 274 is calculated according to equation (28) above.

Referring particularly to FIG. 6, a third preferred embodiment of the invention compensates Maxwell phase as the echo signals are acquired during each EPI pulse sequence. This is accomplished by adding slice-selection gradient lobes 276 during the readout of each echo signal. The amplitude of these trapezoidal gradient lobes 276 is determined by equation (29) above.

Figure 7:
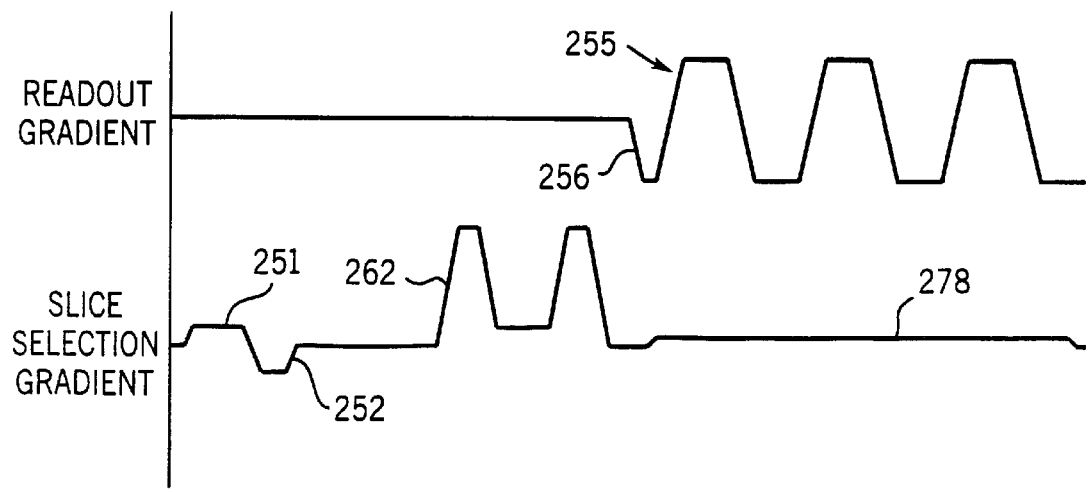

Referring particularly to FIG. 7, a fourth preferred embodiment of the invention compensates Maxwell phase during the readout portion of the EPI pulse sequence. This is accomplished by adding a constant, low amplitude slice-selection gradient 278 during the entire readout period. Using this embodiment of the invention the amplitude of the compensation gradient 278 is given by the above equation (30).

Figure 8:
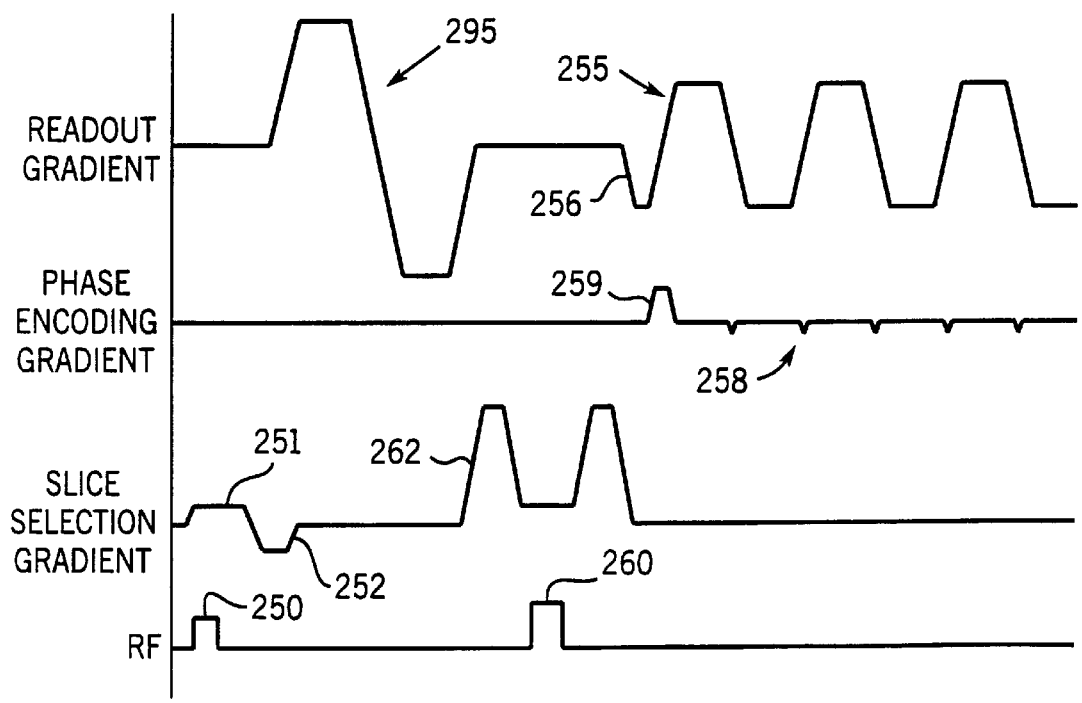

Referring particularly to FIG. 8, in a fifth embodiment of the invention the compensating gradient field is applied in the readout direction. More specifically, a bipolar gradient waveform 295 is produced by the readout gradient prior to the 180° RF pulse 260. The net area of the bipolar gradient 295 is zero so that it does not affect spatial encoding along the readout axis. The Maxwell phase produced by the compensating, bipolar gradient waveform 295 is set equal to the Maxwell phase produced by the alternating readout gradient 255 up to the point where the central echo ($k_y=0$) is acquired. This amplitude can be reduced by lengthening the duration of the bipolar gradient 295.

Figure 9:
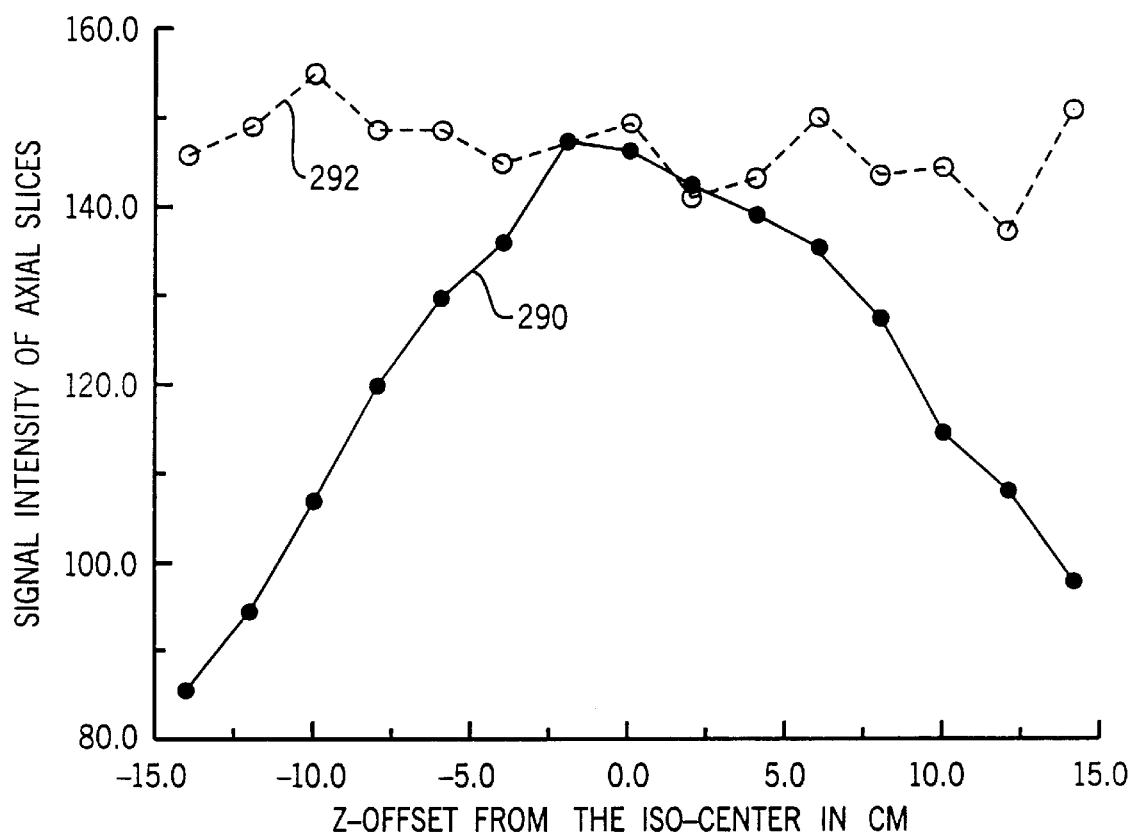
FIG. 9 is a graphic representation illustrating how signal fall-off is corrected when the invention is employed.

Referring particularly to FIG. 9, the effect achieved when the present invention is employed is compared to a conventional EPI pulse sequence without correction. Fifteen axial slices ranging 14 cm to either side of the system iso-center (i.e., z=0) were acquired. The signal intensity was measured by integrating the image intensity for all the pixels within a rectangular region of interest. As indicated by the solid line 290, the signal fall-off for uncorrected images was nearly 50% at the 14 cm distances from the iso-center. On the other hand, as indicated by dashed line 292, when the same axial slices are acquired using the first preferred embodiment of the invention, there is no significant signal fall-off.

We claim:

1. Method for compensating Maxwell term-related errors produced by imaging gradients in an NMR system during the acquisition of an NMR image using a pulse sequence, the steps comprising:

a) producing an RF excitation pulse;

b) producing a slice-selection gradient which cooperates with the RF excitation pulse to excite spins in a slice located a distance (z) from a system iso-center;

c) producing a readout gradient which alternates in polarity to produce a corresponding series of NMR gradient echo signals;

d) producing a phase-encoding gradient to individually spatial-encode the said NMR echo signals;

e) producing a compensating gradient which compensates a Maxwell phase produced in the NMR echo signals by the alternating readout gradient; and f) acquiring the NMR gradient echo signals and reconstructing an image using said signals.

2. The method as recited in claim 1 in which the compensating gradient forms part of the slice-selection gradient and its size is determined by the magnitude of the alternating readout gradient and the distance (z) of the slice from the system iso-center.

3. The method as recited in claim 2 in which the compensating gradient is a single gradient lobe produced before the readout gradient is produced.

4. The method as recited in claim 2 in which the compensating gradient is a single gradient lobe produced substantially throughout the time period during which the alternating readout gradient is produced.

5. The method as recited in claim 2 in which the compensating gradient is a series of gradient lobes that correspond to the NMR echo signals and are produced substantially concurrently with the acquisition thereof.

6. The method as recited in claim 2 in which the compensating gradient is a series of gradient lobes that correspond to the acquired NMR echo signals and are produced between the acquisition thereof.

7. The method as recited in claim 1 in which a 180° refocusing RF pulse is produced after the RF excitation pulse and before the acquisition of the NMR echo signals, and the compensating gradient forms part of the readout gradient and is produced before the 180° refocusing RF pulse is produced, and wherein the net area of the compensating gradient is zero.

* * * * *